US009210823B2

United States Patent
Sawada et al.

(10) Patent No.: US 9,210,823 B2
(45) Date of Patent: Dec. 8, 2015

(54) MOBILE TERMINAL HAVING BOARD SUPPORT STRUCTURE

(75) Inventors: Tatsuo Sawada, Fukuoka (JP); Hiroki Tanaka, Akita (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 195 days.

(21) Appl. No.: 14/005,159

(22) PCT Filed: Mar. 5, 2012

(86) PCT No.: PCT/JP2012/001504
§ 371 (c)(1),
(2), (4) Date: Sep. 13, 2013

(87) PCT Pub. No.: WO2012/124286
PCT Pub. Date: Sep. 20, 2012

(65) Prior Publication Data
US 2014/0003003 A1  Jan. 2, 2014

(30) Foreign Application Priority Data
Mar. 15, 2011  (JP) ................. 2011-056063

(51) Int. Cl.
*H05K 1/14* (2006.01)
*H05K 7/02* (2006.01)
(Continued)

(52) U.S. Cl.
CPC ............. *H05K 7/02* (2013.01); *H04M 1/0277* (2013.01); *H04M 1/185* (2013.01); *H04M 1/0266* (2013.01)

(58) Field of Classification Search
USPC ......... 361/728–730, 752, 796, 800, 807, 809, 361/810; 455/39, 575.9, 550.1, 73, 571.1, 455/403, 422.1; 174/138 E, 138 G
See application file for complete search history.

(56) References Cited

U.S. PATENT DOCUMENTS 6,359,787 B1    3/2002  Peltolehto
7,466,562 B2 *  12/2008  Gilliland et al. .............. 361/807
(Continued)

FOREIGN PATENT DOCUMENTS

JP  5-315772   11/1993
JP  8-153982    6/1996
(Continued)

OTHER PUBLICATIONS

Japanese Office Action dated Dec. 2, 2014.
(Continued)

*Primary Examiner* — Hung S Bui
(74) *Attorney, Agent, or Firm* — Dickinson Wright PLLC (57) ABSTRACT

To provide a mobile terminal having a board support structure capable of reducing impact on built-in components of the mobile terminal when a housing thereof undergoes a primary mode of deformation.
The upper end portion and the lower end portion of a main board 40 are supported by bosses 111*a*, 111*b*, 113*a*, and 113*b*. The upper end portion and the lower end portion of the main board 40 are fixed in a direction perpendicular to the surface of the main board 40. The upper end portion thereof slides with respect to the peripheries of small-diameter cylindrical portion insertion holes 211*a* and 211*b* of a module holding board 30 on the front side and a rear housing 20 on the rear side. Thus, the main board 40 can move in a plane direction (in a longitudinal direction).

12 Claims, 8 Drawing Sheets

(51) Int. Cl.
*H04M 1/18* (2006.01)
*H04M 1/02* (2006.01)

(56) References Cited

U.S. PATENT DOCUMENTS

| | | | |
|---|---|---|---|
| 7,466,563 B2* | 12/2008 | Hsu | 361/810 |
| 7,869,218 B2* | 1/2011 | Ni et al. | 361/737 |
| 8,582,315 B2* | 11/2013 | Nishiyama | 361/807 |
| 2007/0169098 A1 | 7/2007 | Kikuchi | |
| 2009/0264160 A1 | 10/2009 | Mochizuki | |
| 2009/0290089 A1 | 11/2009 | Ichioka | |
| 2012/0092826 A1* | 4/2012 | Heidepriem et al. | 361/679.54 |

FOREIGN PATENT DOCUMENTS

| | | |
|---|---|---|
| JP | 2005-79728 | 3/2005 |
| JP | 2005-283863 | 10/2005 |
| JP | 2007-180751 | 7/2007 |
| JP | 2007-193596 | 8/2007 |
| WO | 2005/069711 | 7/2005 |
| WO | 2008/018233 | 2/2008 |

OTHER PUBLICATIONS

International Search Report dated Jun. 20, 2012.

* cited by examiner

MOBILE TERMINAL HAVING BOARD SUPPORT STRUCTURE

TECHNICAL FIELD

The present invention relates to a board support structure of a mobile terminal.

BACKGROUND ART

The mobile terminal such as a mobile phone and a symbol scanner includes various electronic components, a liquid crystal panel, and the like as built-in components. The electronic components (including an integrated circuit) are fixed to a board, and the liquid crystal panel is held by a holding board. These boards are fixed to a housing of the mobile terminal. If the mobile terminal falls down, the housing receives a shock force due to the fall. Then, if the housing is deformed, a board fixed to the housing is deformed due to the housing deformation. Then, an electronic component fixed to the board receives a stress due to the deformation, which causes a problem in that the electronic component falls off from the board or the electronic component is damaged.

As prior art, there have been proposed various electronic devices constructed to prevent a failure of a built-in component in case a load is applied to the housing due to fall or the like. The prior art related to the present invention includes the following Patent Literatures 1 to 3.

CITATION LIST

Patent Literature

[Patent Literature 1] Japanese Patent Laid-Open No. 2005-283863
[Patent Literature 2] Japanese Patent Laid-Open No. 2005-79728
[Patent Literature 3] International Publication No. WO 2008/018233

SUMMARY OF INVENTION

Technical Problem

Most of the deformation of a housing of a mobile terminal due to a load applied to the housing when the mobile terminal falls down is a primary mode of deformation. Focusing on this point, it is an object of the present invention to provide a mobile terminal having a board support structure capable of reducing impact on built-in components of the mobile terminal when a housing thereof undergoes a primary mode of deformation.

Solution to Problem

In order to solve the above conventional problem, a mobile terminal having a board support structure of the present invention has a configuration in which at least one edge of a board is movable in a plane direction of the board with respect to a housing of the mobile terminal. In case the housing is deformed by an impact due to the fall of the mobile terminal, the board absorbs the deformation of the housing by moving in a plane direction to reduce the deformation of the board itself, whereby this configuration can reduce the impact on components held on the board.

Further, in the mobile terminal having the board support structure of the present invention, the board may be substantially rectangular and may be movable in a longitudinal direction. This configuration can reduce deformation particularly in an easily deformable longitudinal direction of the board and can effectively reduce the impact on components held on the board.

Further, in the mobile terminal having the board support structure of the present invention, the board is supported by a support member on a short edge side and at least one of short edges may be fixed in a direction perpendicular to the plane of the board, and may be movable in the plane direction of the board by sliding with respect to the support member. This configuration allows the board to be fixed in a vertical direction, which can make the board movable in a plane direction and held by the housing.

Further, in the mobile terminal having the board support structure of the present invention, the support member may sandwich the board between one surface and other surface and may tighten the board between the one surface and the other surface by screw fastening. This configuration can make the board movable in a plane direction and held by the housing. Further, ease of movement of the board in a plane direction can be adjusted by adjusting the screw tightening strength.

Further, in the mobile terminal having the board support structure of the present invention, two opposing edges of the board may be movable in a direction perpendicular to the edges. This configuration allows the board to more appropriately absorb deformation of the housing by moving in a plane direction.

Further, in the mobile terminal having the board support structure of the present invention, one edge of the board may be movable in a direction perpendicular to the edge. In this configuration, in a state in which the housing is not deformed, the board is always positioned in a predetermined position and can reliably maintain the positional relation to other components; and in a state in which the housing is deformed, the board can move in a plane direction to absorb deformation of the housing.

Further, in the mobile terminal having the board support structure of the present invention, the mobile terminal may be substantially rectangular when viewed from a plane direction of the board and may include a plurality of the boards divided in a longitudinal direction. This configuration can reduce impact of deformation on one side in a longitudinal direction of the housing on the board on other side in a longitudinal direction; and can reduce impact of deformation on the other side in a longitudinal direction of the housing on the board on the one side in a longitudinal direction.

Advantageous Effects of Invention

According to the present invention, in case a housing of a mobile terminal is deformed by an impact due to the fall of the mobile terminal, a board thereof absorbs the deformation of the housing by moving in a plane direction to reduce the deformation of the board itself and to thereby be able to reduce the impact on components held on the board.

DESCRIPTION OF EMBODIMENTS

Figure 2:
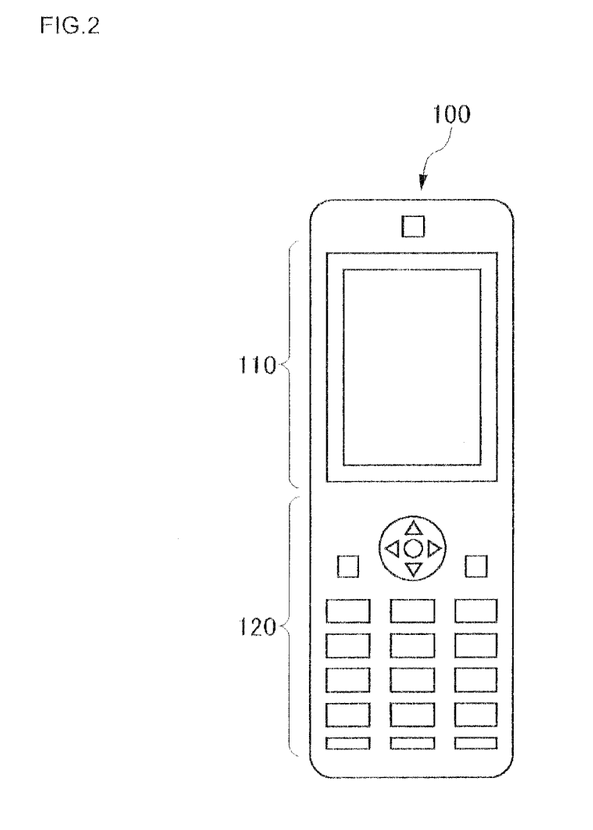
FIG. 2 is a front view of the mobile terminal according to the embodiment of the present invention.
Figure 3:
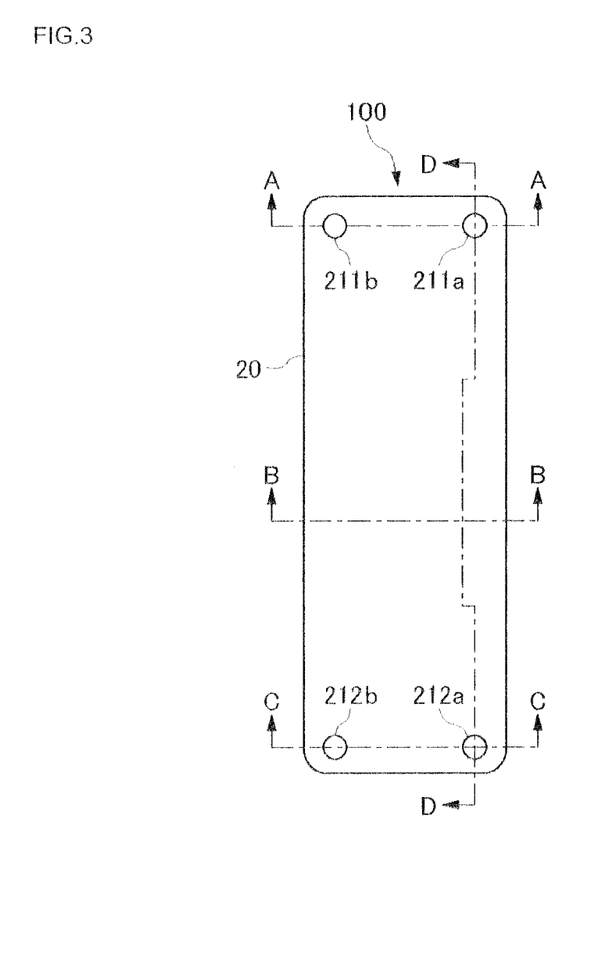
FIG. 3 is a rear view of the mobile terminal according to the embodiment of the present invention.

Hereinafter, an embodiment for carrying out the present invention will be described with reference to the accompanying drawings. Each drawing of the present application omits or simplifies the illustration of a portion and a component which is not related to the configuration of the present invention. FIGS. 2 and 3 respectively are a front view and a rear view of a mobile terminal according to the embodiment of the present invention. In the present description, the vertical direction in FIG. 2 may be expressed as up and down; the horizontal direction in FIG. 2 may be expressed as left and right; the toward direction orthogonal to the sheet in FIG. 2 may be expressed as front (side) or front; and the depth direction orthogonal to the sheet in FIG. 2 may be expressed as a back (side) or rear.

As illustrated in FIGS. 2 and 3, a mobile terminal 100 has a substantially rectangular parallelepiped shape and each of the front and the rear thereof has a vertically long and substantially rectangular shape. The housing of the mobile terminal 100 includes a front housing 10 and a rear housing 20. The front housing 10 and the rear housing 20 have a substantially rectangular parallelepiped shape with the inside surfaces being opened. The front housing 10 includes a top face, a right face, a bottom face, and a left face substantially vertically arranged on the respective edges of the rectangular front face; and the rear housing 20 also includes a top face, a right face, a bottom face, and a left face substantially vertically arranged on the respective edges of the rectangular rear face. When the front housing 10 and the rear housing 20 are joined with the opened inside surfaces facing each other, each end portion of the top face, the right face, the bottom face, and the left face of the front housing 10 are matched with the respective end portion of the top face, the right face, the bottom face, and the left face of the rear housing 20 to form a sealed storage space therein.

The upper half part of the mobile terminal 100 is a liquid crystal region 110 having a liquid crystal panel arranged thereon. The liquid crystal region 110 includes therein an LCD module and an LCD module holding board as well as a main board of the mobile terminal 100. The lower half part of the mobile terminal 100 is a key region 120. The front housing 10 of the key region 120 includes thereon a plurality of keys such as a cross-shaped key and numeric keys. The key region 120 includes therein a key board that detects pressing of a key of the various keys and generates a signal and also includes a battery. As illustrated in FIG. 3, the rear surface of the mobile terminal 100 includes screw insertion holes 211a, 211b, 212a, and 212b on the four corners thereof.

Figure 4:
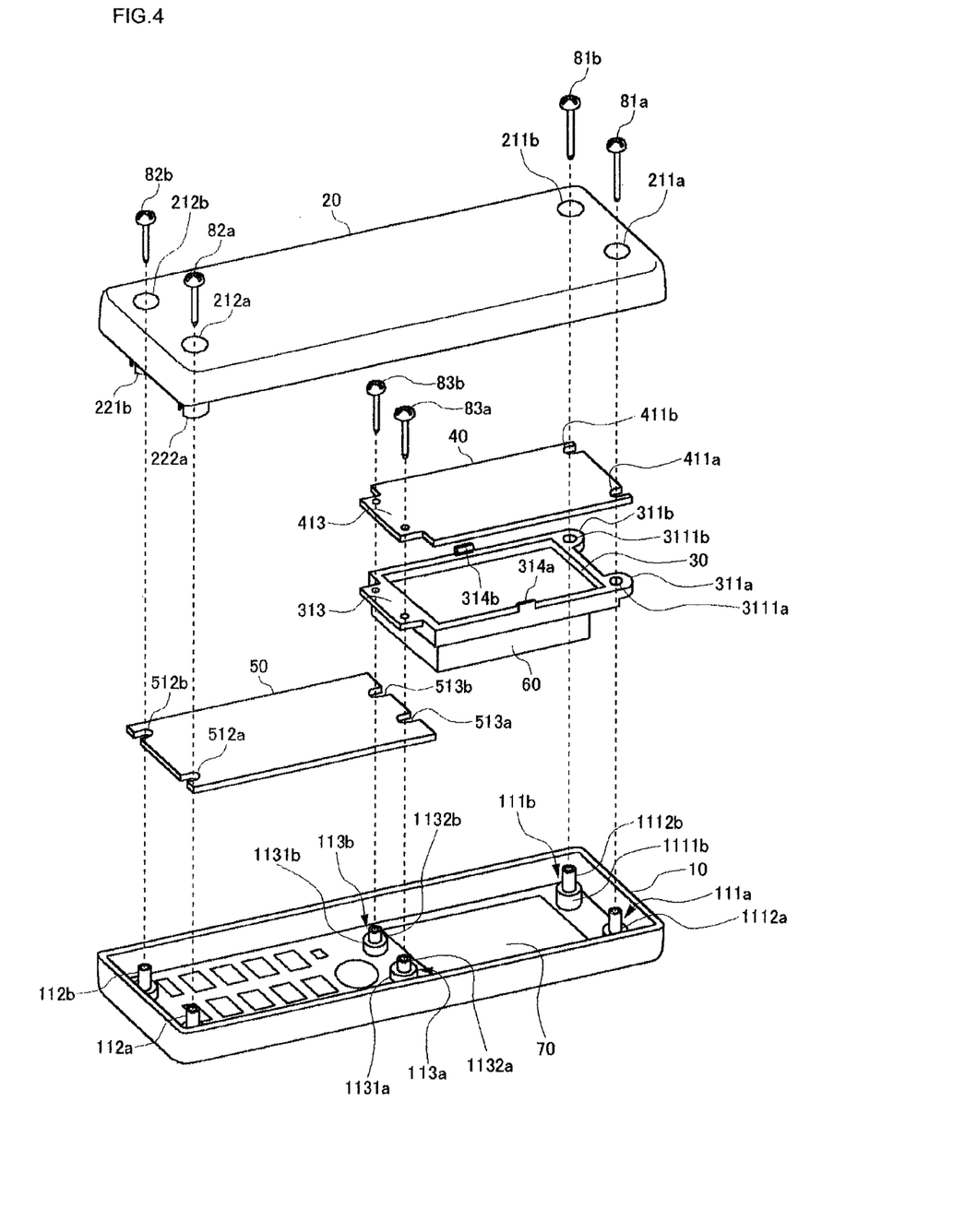
FIG. 4 is an exploded perspective view of the mobile terminal according to the embodiment of the present invention.
Figure 5:
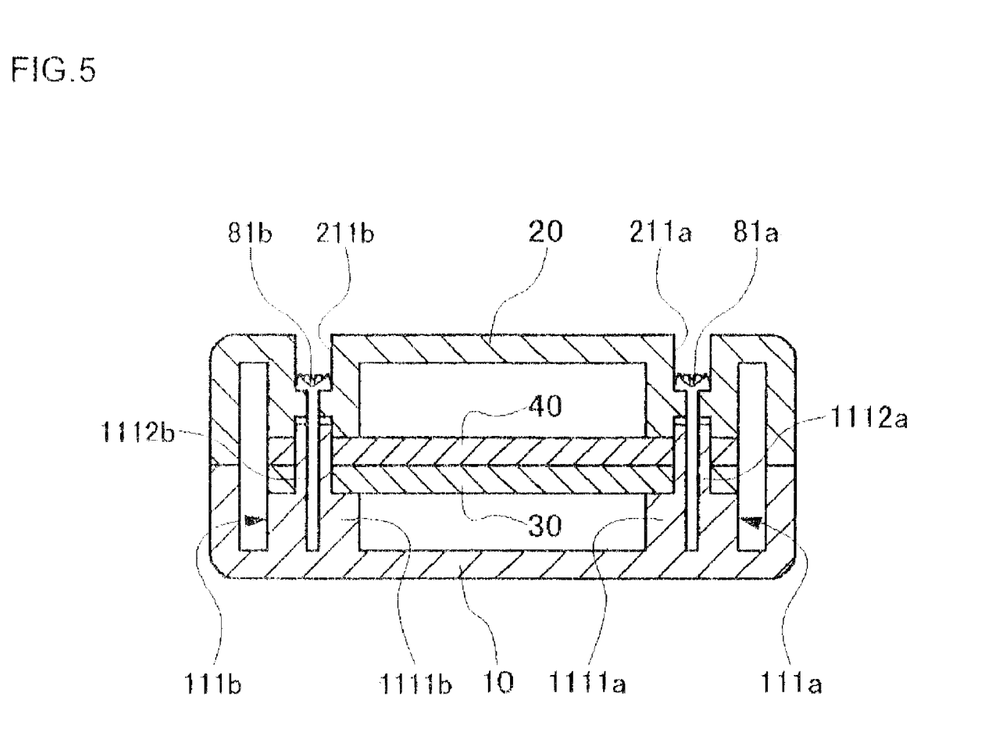
FIG. 5 is a sectional view along line A-A of the mobile terminal according to the embodiment of the present invention.

FIG. 4 is an exploded perspective view of the mobile terminal 100 according to the embodiment of the present invention. Hereinafter, with reference to FIG. 4, a board support structure of the mobile terminal 100 according to the embodiment of the present invention will be described in detail.

With reference to FIG. 4, the front housing 10 includes bosses 111a, 111b, 112a, and 112b standing therein so as to respectively correspond to the screw insertion holes 211a, 211b, 212a, and 212b at the four corners of the rear housing 20. Further, the front housing 10 includes bosses 113a and 113b standing right and left therein respectively near the center in the vertical direction. The bosses 111a, 111b, 112a, 112b, 113a, and 113b are formed in a two-step shape: large-diameter cylindrical portions 1111a, 1111b, 1121a, 1121b, 1131a, and 1131b fixed to the back surface of the front housing 10; and small-diameter cylindrical portions 1112a, 1112b, 1122a, 1122b, 1132a, and 1132b formed thereon.

Each upper surface of the large-diameter cylindrical portions 1111a, 1111b, 1121a, 1121b, 1131a, and 1131b of the respective bosses 111a, 111b, 112a, 112b, 113a, and 113b serves as a board seat (hereinafter referred to as "a middle seat"). Further, each of the bosses 111a, 111b, 112a, 112b, 113a, and 113b includes therein a screw hole.

The key region 120 includes thereinside a key board 50. The upper end portion of the key board 50 includes U-shaped notches 513a and 513b respectively corresponding to the bosses 113a and 113b. The lower edge of the key board 50 includes U-shaped notches 512a and 512b respectively corresponding to the bosses 112a and 112b. The widths of the notches 513a, 513b, 512a, and 512b in the horizontal direction are equal to the diameters of the respective small-diameter cylindrical portions of the bosses 113a, 113b, 112a, and 112b. The depths of the notches 513a, 513b, 512a, and 512b in the vertical direction are slightly greater than the diameters of the respective small-diameter cylindrical portions of the bosses 113a, 113b, 112a, and 112b.

The distance between the notch 513a and the notch 512a is less than the distance between the small-diameter cylindrical portion 1132a of the boss 113a and the small-diameter cylindrical portion 1122a of the boss 112a respectively. The distance between the notch 513b and the notch 512b is less than the distance between the small-diameter cylindrical portion 1132b of the boss 113b and the small-diameter cylindrical portion 1122b of the boss 112b respectively (see FIG. 1).

The notches 513a, 513b, 512a, and 512b are formed smaller than the middle seats of the bosses 113a, 113b, 112a, and 112b respectively. When the key board 50 is attached to the front housing 10, the peripheries of the notches 513a, 513b, 512a, and 512b are supported by the middle seats of the respective bosses 113a, 113b, 112a, and 112b. This configuration allows the key board 50 to slightly move in the vertical direction, namely, in a longitudinal direction thereof in a state of being supported by the middle seats of the bosses 113a, 113b, 112a, and 112b.

Note that the widths in the horizontal direction of the notches 513a, 513b, 512a, and 512b are equal to the widths of the small-diameter cylindrical portions 1132a, 1132b, 1122a, and 1122b of the bosses 113a, 113b, 112a, and 112b respectively. Thus, the key board 50 does not move in the horizontal direction in the state of being supported by the middle seats of the bosses 113a, 113b, 112a, and 112b.

The liquid crystal region 110 includes thereinside an LCD module 60, an LCD module holding board 30, and a main board 40 arranged in the order starting with the front side. The LCD module 60 is fixed to the LCD module holding board 30. The LCD module 60 has a liquid crystal panel on the front side so as to be arranged such that a liquid crystal panel display can be viewed from the front side through a transparent LCD protection panel 70 provided in the front housing 10. Here, the LCD module holding board 30 may be a plastic frame having no circuits.

The rear side of the LCD module holding board 30 includes a side wall as a frame so as to extend around the four sides: upward, downward, left, and right, and to protrude toward the rear side. The portion except the frame (peripheral portion) on the rear side is recessed on the front side. The side wall protruding toward the rear side serves as a seat for supporting the main board 40. Note that the recessed portion on the rear side of the LCD module holding board 30 serves as a space for housing various electronic elements attached to the front side of the main board 40.

The right and left portions of the upper end portion of the LCD module holding board 30 include protruding seats 311a and 311b respectively corresponding to the bosses 111a and 111b of the front housing 10. The protruding seats 311a and 311b include small-diameter cylindrical portion through-holes 3111a and 3111b for passing the small-diameter cylindrical portions 1112a and 1112b of the upper portions of the bosses 111a and 111b therethrough. The diameters of the small-diameter cylindrical portion through-hole 3111a and 3111 substantially match the diameters of the small-diameter cylindrical portions 1112a and 1112b of the bosses 111a and 111b. The central portion of the lower end portion of the LCD module holding board 30 includes a seat 313 having screw holes provided in both right and left portions for inserting screws 83a and 83b to be threadedly fitted into the screw holes of the bosses 113a and 113b of the front housing 10.

The central portion of the right and left frames of the LCD module holding board 30 includes locking claws 314a and 314b protruding toward the rear side. The locking claws 314a and 314b lock the main board 40 so as to prevent the main board 40 from bending in such a way that when the housing is deformed, the central portion of the main board 40 rises to be convex toward the rear side.

The front surface and the rear surface of the main board 40 respectively include electronic components (unillustrated) such as semiconductor chips. The central portion of the lower end portion of the main board 40 includes a seat 413 having screw holes in both right and left portions for inserting screws to be threadedly fitted into the screw holes of the bosses 113a and 113b of the front housing 10. The shape of the seat 413 corresponds to the shape of the seat 313 of the LCD module holding board 30.

The both right and left portions of the upper end portion of the main board 40 include U-shaped notches 411a and 411b respectively. The widths of the notches 411a and 411b in the horizontal direction are equal to the diameters of the small-diameter cylindrical portions 1112a and 1112b of the bosses 111a and 111b; and the diameters of the protruding seats 311a and 311b of the LCD module holding board 30. The depths of the notches 411a and 411b in the vertical direction are slightly greater than the diameters of the small-diameter cylindrical portions 1112a and 1112b of the bosses 111a and 111b.

FIGS. 1, 5, 6, and 7 respectively are a sectional view along line D-D, a sectional view along line A-A, a sectional view along line B-B, and a sectional view along line C-C of the mobile terminal 100 according to the embodiment of the present invention. With reference to FIGS. 1, 5, 6, and 7, along with FIG. 4, the structure of the mobile terminal 100 including a combination of aforementioned members will be described.

When the key board 50 is attached to the key region 120 of the front housing 10, the small-diameter cylindrical portions 1122a and 1122b of the bosses 112a and 112b of the front housing 10 are fitted into the respective notches 512a and 512b; and the small-diameter cylindrical portions 1132a and 1132b of the bosses 113a and 113b of the front housing 10 are fitted into the respective notches 513a and 513b. The peripheries of the notches 512a and 512b of the key board 50 are supported by the middle seats of the bosses 112a and 112b; and the peripheries of the notches 513a and 513b of the key board 50 are supported by the middle seats of the bosses 113a and 113b.

As described above, the widths in the horizontal direction of the notches 513a, 513b, 512a, 512b are equal to the diameters of the small-diameter cylindrical portions 1132a, 1132b, 1122a, and 1122b of the bosses 113a, 113b, 112a, and 112b respectively. The depths of the notches 513a, 513b, 512a, and 512b in the vertical direction are slightly greater than the diameters of the small-diameter cylindrical portions 1132a, 1132b, 1122a, and 1122b of the bosses 113a, 113b, 112a, and 112b respectively. Thus, in this state, the key board 50 does not move left or right but can slightly move in the vertical direction. Thus, in case the mobile terminal 100 falls down and the housing is deformed by an impact due to the fall, causing a change in distance between the bosses 113a and 113b and the bosses 112a and 112b, the key board 50 absorbs such a change in distance by moving the middle seats of the bosses 113a, 113b, 112a, and 112b in the vertical direction to thereby be able to reduce the deformation of the key board 50.

In a state in which the key board 50 is attached to the front housing 10, the LCD module holding board 30 holding the LCD module 60 is attached to the liquid crystal region 110 with the LCD module 60 facing the front side. The small-diameter cylindrical portions through-hole 3111a and 3111b of the protruding seats 311a and 311b of the LCD module holding board 30 are fitted into the small-diameter cylindrical portions 1112a and 1112b in the upper portion of the bosses 111a and 111b. The peripheries of the small-diameter cylindrical portions through-hole 3111a and 3111b of the protruding seat 311a and 311b are supported by the middle seats of the bosses 111a and 111b. As described above, the diameters of the small-diameter cylindrical portions through-hole 3111a and 3111b of the protruding seats 311a and 311b are equal to the diameters of the small-diameter cylindrical portions 1112a and 1112b of the bosses 111a and 111b. Thus, the LCD module holding board 30 does not move in upward, downward, left, or right direction.

Figure 1:
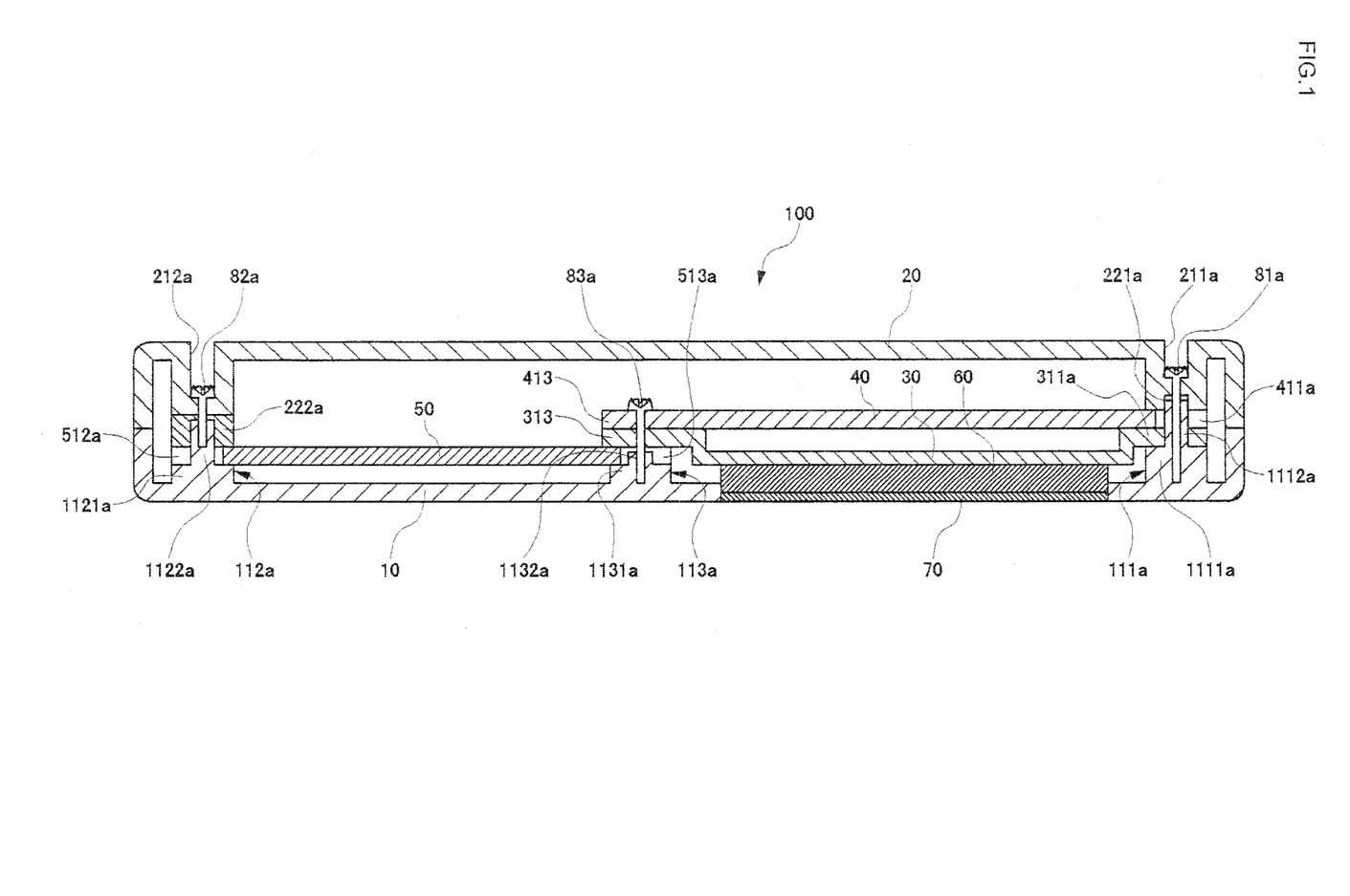
FIG. 1 is a sectional view along line D-D of a mobile terminal according to an embodiment of the present invention.
Figure 6:
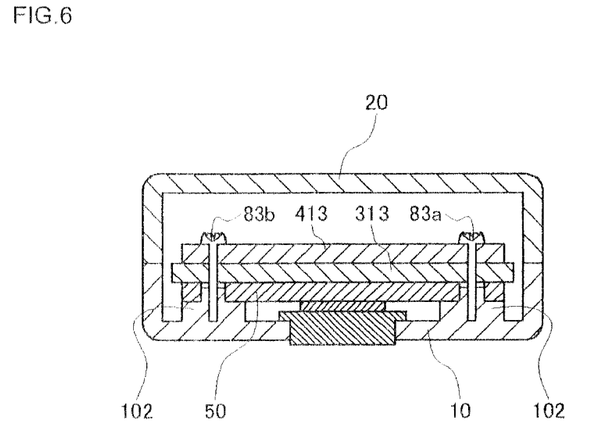
FIG. 6 is a sectional view along line B-B of the mobile terminal according to the embodiment of the present invention.
Figure 7:
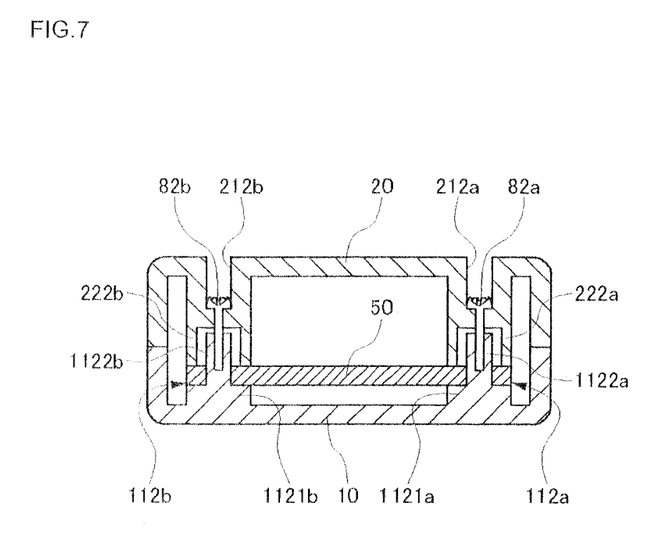
FIG. 7 is a sectional view along line C-C of the mobile terminal according to the embodiment of the present invention.

At this time, the seat 313 provided on a lower side of the LCD module holding board 30 presses the peripheries of the notches 513a and 513b of the key board 50 and the portion between the notch 513a and the notch 513b from top to bottom. The screw holes provided in the seat 313 correspond to the screw holes of the bosses 113a and 113b. As illustrated in FIGS. 1 and 6, the upper end portion of the bosses 113a and 113b is slightly lower than the surface of the key board 50. Thus, the LCD module holding board 30 is not supported by the bosses 113a and 113b, but the lower end portion thereof is supported by the key board 50.

In a state in which the LCD module holding board 30 is attached, the main board 40 having electronic components on both surfaces is attached to the liquid crystal region 110. The screws 83a and 83b are inserted into the screw holes of the seat 413 in the lower end portion of the main board 40. The screws are further inserted into the respective screw holes provided in the seat 313 of the LCD module holding board 30 to be threadedly fitted into the screw holes of the bosses 113a and 113b. In other word, the lower end portion of the main board 40 is fixed to the bosses 113a and 113b of the front housing 10.

At this time, the small-diameter cylindrical portions of the bosses 111a and 111b passing through the small-diameter cylindrical portion through-holes of the protruding seats 311a and 311b of the LCD module holding board 30 are fitted into the notches 411a and 411b in the upper edge of the main board 40. At this time, the central portion in the vertical direction on the right and left edges of the main board 40 is locked by the locking claws 314a and 314b provided on the rear side of the LCD module holding board 30.

As described above, the widths in right and left directions of the notches 411a and 411b are equal to the diameters of the small-diameter cylindrical portions of the bosses 111a and 111b and the diameters of the protruding seats 311a and 311b of the LCD module holding board 30; and the depths in the vertical direction of the notches 411a and 411b are slightly greater than the diameters of the small-diameter cylindrical portions of the bosses 111a and 111b. Thus, in case the mobile terminal 100 falls down and the housing is deformed by an impact due to the fall, causing a change in distance between the bosses 111a and 111b and the bosses 112a and 112b, the main board 40 absorbs such a change in distance by moving the middle seats of the bosses 111a and 111b in the vertical direction to thereby be able to reduce the deformation of the main board 40.

In this state, the rear housing 20 is attached to the front housing 10. Inside the upper end portion of the rear housing 20, small-diameter cylindrical portion insertion holes 221a and 221b are formed in positions facing the screw insertion holes 211a and 211b. The distal end portions of the small-diameter cylindrical portions 1111a and 1111b of the bosses 111a and 111b of the front housing 10 are inserted into the small-diameter cylindrical portion insertion holes 221a and 221b. In this state, the screws 81a and 81b are inserted from the screw insertion holes 211a and 211b of the rear housing 20 to be threadedly fitted into the screw holes of the bosses 111a and 111b of the front housing 10. Thus, the peripheries of the small-diameter cylindrical portion insertion holes 221a and 221b of the rear housing 20 press the peripheries of the notches 411a and 411b of the main board 40 in the front direction so as to firmly fix the upper end portions of the LCD module holding board 30 and the main board 40 in the front and rear directions.

Note that at this time, the upper surfaces of the small-diameter cylindrical portions 1112a and 1112b of the front housing 10 do not reach up to the bottom surfaces of the screw insertion holes 211a and 211b of the rear housing 20. Thus, the bottom surfaces of the screw insertion holes 211a and 211b of the rear housing 20 interfere with the small-diameter cylindrical portions 1112a and 1112b of the front housing 10, to thereby be able to prevent the upper end portion of the LCD module board 30 and the main board 40, which should be tightly held by the rear housing 20 and the front housing 10, from loosening in the front and rear directions.

The peripheries of the notches 411a and 411b in the upper end portion of the main board 40 are sandwiched between the peripheries of the screw insertion holes 211a and 211b of the rear housing 20 and the protruding seats 311a and 311b of the LCD module holding board 30 in the front and rear directions. Even in this state, the upper end portion of the main board 40 can move in the vertical direction with respect to the rear housing 20, the front housing 10, and the LCD module holding board 30 by sliding with respect to the rear housing 20 and the LCD module holding board 30.

Meanwhile, inside the upper end portion of the rear housing 20, board pressing ribs 222a and 222b are formed in positions facing the screw insertion holes 212a and 212b. In a state in which the rear housing 20 is attached to the front housing 10, the board pressing ribs 222a and 222b abut against the peripheries of the notches 512a and 512b in the lower end portion of the key board 50. The screws 82a and 82b are inserted into the screw insertion holes 212a and 212b of the rear housing 20 to be threadedly fitted into screw holes of the bosses 112a and 112b of the front housing 10 so as to press the peripheries of the notches 512a and 512b of the key board 50 to the middle seats of the bosses 112a and 112b of the front housing 10.

Note that at this time, the upper surfaces of the small-diameter cylindrical portions 1122a and 1122b of the bosses 112a and 112b of the front housing 10 do not reach up to the rear housing 20. Thus, the rear housing 20 interferes with the small-diameter cylindrical portions 1122a and 1122b of the front housing 10, to thereby be able to prevent the lower end portion of the key board 50, which should be tightly held by the pressing ribs 222a and 222b of the rear housing 20 and the middle seat of the boss 112a of the front housing 10, from loosening in the front and rear directions.

The peripheries of the notches 512a and 512b in the lower end portion of the key board 50 are sandwiched between the pressing ribs 222a and 222b and the middle seat of the boss 112a of the front housing 10 in the front and rear directions. Even in this state, the lower end portion of the key board 50 can move in the vertical direction by sliding with respect to the rear housing 20 and the front housing 10.

As described above, according to the mobile terminal 100 of the present embodiment, both the upper end portion and the lower end portion of the key board 50 can move in the vertical direction with respect to the rear housing 20 and the front housing 10; and the upper end portion of the main board 40 can move in the vertical direction with respect to the rear housing 20 and the front housing 10. Thus, in case the rear housing 20 and the front housing 10 are deformed by an impact, the key board 50 and the main board 40 absorb the deformation of the rear housing 20 and the front housing 10 by moving in the vertical direction to reduce the deformation of the rear housing 20 and the front housing 10 to thereby reduce the deformation of the key board 50 and the main board 40.

Further, according to the mobile terminal of the present embodiment, the required boards are divided into two boards: the key board 50 on the lower side (key region 120) and the main board 40 on the upper side (liquid crystal region 110), whereby an effect of an upper side deformation of the rear housing 20 and the front housing 10 on a lower side deformation of the key board 50 can be reduced and an effect of a lower side deformation of the rear housing 20 and the front housing 10 on an upper side deformation of the main board 40 can be reduced.

Figure 8:
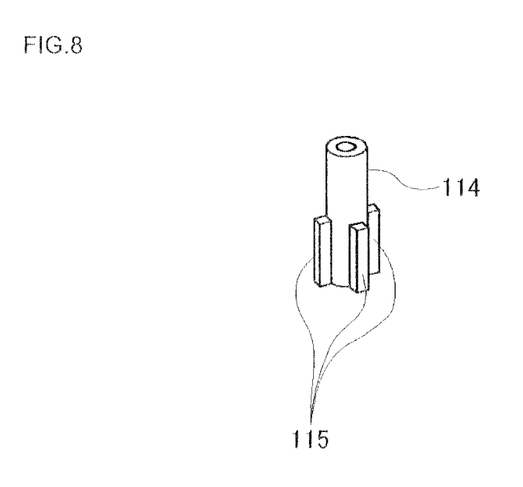
FIG. 8 is a perspective view of a boss according to a variation of the embodiment of the present invention.

Hereinbefore one of the embodiments of the present invention has been described. The present invention is not limited to the above-described embodiment and various modifications can be made to the embodiment. For example, the bosses 111a, 111b, 112a, 112b, 113a, and 113b of the present embodiment are formed in a two-step configuration: the large-diameter cylindrical portions and the small-diameter cylindrical portions, but only the small-diameter cylindrical portions may be used. FIG. 8 is a perspective view of a variation of the bosses 111a, 111b, 112a, 112b, 113a, and 113b. A boss 114 of the variation has only the small-diameter cylindrical portion, but has a plurality of seat pillars 115 provided therearound with the same height as that of the middle seat of the present embodiment. Such a configuration also allows the upper end portion of the seat pillar 115 to support the key board 50 and the LCD module holding board 30. Further, the seat for supporting the key board 50 and the LCD module holding board 30 may be positioned far away from the boss 114 having only the small-diameter cylindrical portion.

Further, according to the present embodiment, both the upper and lower ends of the key board 50 can move in the vertical direction, but only one end thereof may move in the vertical direction like the main board 40 and the other end thereof may be fixed to the rear housing 20 or the front housing 10. Furthermore, according to the present embodiment, only the upper end portion of the main board 40 can move in the vertical direction, but only the lower end portion thereof may move in the vertical direction or both the upper and lower ends thereof may move in the vertical direction.

Still furthermore, according to the present embodiment, both the upper and lower ends of the key board 50 and the upper end portion of the main board 40 can move in the vertical direction, but any other boards may move in the vertical direction. Still furthermore, according to the present embodiment, both the upper and lower ends of the key board 50 and the upper end portion of the main board 40 cannot move in the horizontal direction and can move only in the vertical direction, but may move in the horizontal direction. In order to achieve this configuration, the widths the horizontal direction of the notches 512a, 512b, 513a, 513b, 411a, and 411b only needs to be slightly greater than the diameters of the bosses 112a, 112b, 113a, 113b, 111a, and 111b.

The mobile terminal 100 of the present embodiment can be applied to an apparatus such as a mobile phone and a mobile symbol scanner, whose housing would receive a big impact. Various components may be housed in the housing according to a specific application of the mobile terminal 100. For example, when applied to a mobile symbol scanner, an assay laser for reading is provided on the rear side of the mobile terminal 100 and accordingly a reading window is provided in the rear housing 20. According to the present embodiment, a part of the rear housing 20 directly presses the lower end portion of the key board 50 and the upper end portion of the main board 40 toward the front side, but as described above, according to a specific application of the mobile terminal 100, the rear housing 20 may press the key board 50 and the main board 40 through other components.

INDUSTRIAL APPLICABILITY

As described above, in case a mobile terminal falls down and a housing thereof is deformed by an impact due to the fall, a board thereof absorbs the deformation of the housing by moving in a plane direction to reduce the deformation of the board itself. Thus, the present invention has an effect of reducing the impact on components held on the board and is useful as a mobile terminal having a board support structure.

REFERENCE SIGNS LIST 100 mobile terminal
110 liquid crystal region
120 key region
10 front housing
20 rear housing
30 LCD module holding board
40 main board
50 key board
60 LCD module
70 LCD protection panel
111a, 111b boss
1111a, 1111b large-diameter cylindrical portion
1112a, 1112b small-diameter cylindrical portion
112a, 112b boss
1121a, 1121b large-diameter cylindrical portion
1122a, 1122b small-diameter cylindrical portion
113a, 113b boss
1131a, 1131b large-diameter cylindrical portion
1132a, 1132b small-diameter cylindrical portion
211a, 211b, 212a, 212b screw insertion hole
221a, 221b small-diameter cylindrical portion insertion hole
222a, 222b board pressing rib
311a, 311b protruding seat
331a, 331b protruding seat
3111a, 3111b small-diameter cylindrical portion through-hole
313 seat
314a, 314b locking claw
411a, 411b notch
413 seat
512a, 512b notch
513a, 513b notch
81a, 81b screw
82a, 82b screw
83a, 83b screw
115 seat pillar

The invention claimed is:

1. A housing comprising:
a board contained in the housing,
a first passing member passing through one edge of the board,
a second passing member passing through the other edge which is opposite to the one edge of the board,
a first contact portion of a first surface of the board located on a periphery of the first passing member or the second passing member, and
a second contact portion of a second surface of the board located opposite to the first contact portion across the board,
the board further comprises
a first through portion which the first passing member passes through,
a second through portion which the second passing member passes through,
wherein at least first or second through portion is larger than a diameter of the second passing member in a first direction in parallel with the surface of the board, and
wherein a distance between the first passing member and the second passing member can be changed in the first direction.

2. The housing according to claim 1, wherein
the first and second through portions are the same size as the diameter of the second passing member in a second direction in parallel with the surface of the board which is perpendicular to the first direction.

3. The housing according to claim 1, wherein
the board is substantially rectangular, and
the first direction is in parallel with the surface of the board and along a long side of the surface.

4. The housing according to claim 3, wherein
a plurality of the boards are arranged in the first direction.

5. The housing according to claim 4, wherein
the plurality of the boards are partially overlapped in a direction which is perpendicular to the surface of the board.

6. The housing according to claim 5, wherein
the plurality of the boards comprise, in their overlapping portion, a common through portion which a common passing member passes through.

7. The housing according to claim 6, wherein
in the overlapping portion of the plurality of the boards,
at least one board of the plurality of the boards comprises a first common through portion which is the same size as the diameter of the common passing member, and
the other board comprises a second common through portion,
which is larger than a diameter of the common passing member in the first direction, and which is the same size as the diameter of the common passing member in the second direction.

8. A mobile terminal comprising a display module and a housing accordance to claim 7, wherein
the housing comprises a input/display surface, the input/display surface comprising a key region and a display region for viewing of a display of the display module,
the plurality of the boards are arranged in order of (a) a key board attached inside the housing in the key region, (b) a display module holding board for fixing the display module inside the display region, (c) a main board, in a view from the input/display surface side,
a first overlapping portions of the three boards (a), (b) and (c) are located between the key region and the display region, in a view from the input/display surface side,
a second overlapping portions of the two boards (b) and (c) are located in an end portion opposite to the first overlapping portion,
the display region is surrounded by an edge of a surface of the (c) main board, in a view from the input/display surface side, and
the (b) display module holding board comprises a recessed portion in a opposite side of the input/display surface.

9. The mobile terminal according to claim 8, wherein
the (b) display module holding board comprises a locking claw for locking the (c) main board, the locking claw protruding towards the opposite side of the input/display surface than the (c) main board.

10. The mobile terminal according to claim 8, wherein
the (b) display module holding board and the (c) main board comprises the first common through portion in the first overlapping portion of the three boards (a), (b) and (c), and the (a) key board comprises the second common through portion in the first overlapping portion.

11. The mobile terminal according to claim 8, wherein
at the second overlapping portions of the two boards (b) and (c), the (b) display module holding board comprises a first common through portion, and the (c) main board comprises a second common through portion.

12. The mobile terminal according to claim 8, wherein
the second common through portion is provided in an end portion of the (a) key board opposite to the first and second overlapping portion.

* * * * *